(12) United States Patent
Sando et al.

(10) Patent No.: US 11,600,900 B2
(45) Date of Patent: Mar. 7, 2023

(54) ELECTRONIC DEVICE

(71) Applicant: FUJITSU CLIENT COMPUTING LIMITED, Kanagawa (JP)

(72) Inventors: Yoshiyuki Sando, Kawasaki (JP); Yasufumi Yamamoto, Kawasaki (JP); Kenji Suzuki, Kawasaki (JP)

(73) Assignee: FUJITSU CLIENT COMPUTING LIMITED, Kanagawa (JP)

( * ) Notice: Subject to any disclaimer, the term of this patent is extended or adjusted under 35 U.S.C. 154(b) by 209 days.

(21) Appl. No.: 16/934,318

(22) Filed: Jul. 21, 2020

(65) Prior Publication Data

US 2021/0091452 A1 Mar. 25, 2021

(30) Foreign Application Priority Data

Sep. 25, 2019 (JP) ............................. JP2019-174733

(51) Int. Cl.
*H01Q 1/42* (2006.01)
*H01Q 1/22* (2006.01)
(Continued)

(52) U.S. Cl.
CPC ............ *H01Q 1/2266* (2013.01); *H01Q 1/42* (2013.01); *H05K 5/0008* (2013.01); *H05K 5/0017* (2013.01); *H05K 5/03* (2013.01)

(58) Field of Classification Search
CPC ..... H04M 1/0249; H05K 5/0017; H05K 5/03; H05K 5/0008; H01Q 1/2266; H01Q 1/42;
(Continued)

(56) References Cited

U.S. PATENT DOCUMENTS

| 8,262,425 B1* | 9/2012 | Jones | .................. B63J 3/04 441/74 |
| 2012/0039029 A1* | 2/2012 | Allen | .................. H04M 1/0235 361/679.01 |

(Continued)

FOREIGN PATENT DOCUMENTS

| JP | 2014-120881 A | 6/2014 |
| JP | 2018-029132 A | 2/2018 |

(Continued)

OTHER PUBLICATIONS

Notification of Reasons for Refusal issued in Japanese Patent Application No. 2019-174733, dated Jan. 21, 2020 (8 pages).
(Continued)

*Primary Examiner* — Dieu Hien T Duong
(74) *Attorney, Agent, or Firm* — Osha Bergman Watanabe & Burton LLP

(57) ABSTRACT

An electronic device includes a casing, an antenna, a plurality of screw members, and a board. The casing includes: a first cover including a first wall from which a display screen of a display device is exposed; and a second cover overlapping with the first cover in a first direction intersecting with the display screen. The antenna is provided between the first cover and the second cover. The screw members connect the first cover and the second cover. The board is provided, on an opposite side of the antenna, away from one of the screw members that is closest to the antenna. The board is provided without being fastened along with the first cover and the second cover by the one of the screw members.

4 Claims, 11 Drawing Sheets

(51) Int. Cl.
*H05K 5/00* (2006.01)
*H05K 5/03* (2006.01)

(58) Field of Classification Search
CPC ..... H01Q 1/243; G06F 1/1658; G06F 1/1626; G06F 1/1633; G06F 1/1656; G06F 1/1698
See application file for complete search history.

(56) References Cited

U.S. PATENT DOCUMENTS

| | | | |
|---|---|---|---|
| 2012/0077448 A1* | 3/2012 | Yagi | H01Q 5/321 343/860 |
| 2013/0005409 A1* | 1/2013 | Okamoto | H04M 1/0237 455/575.1 |
| 2018/0054903 A1 | 2/2018 | Yamamoto et al. | |
| 2021/0091452 A1* | 3/2021 | Sando | H04M 1/0249 |

FOREIGN PATENT DOCUMENTS

| | | |
|---|---|---|
| JP | 3561705 B2 | 8/2019 |
| WO | 2016/103524 A1 | 6/2016 |

OTHER PUBLICATIONS

Notification of Reasons for Refusal issued in Japanese Patent Application No. 2019-174733, dated Jun. 30, 2020 (9 pages).

* cited by examiner

FIG.10
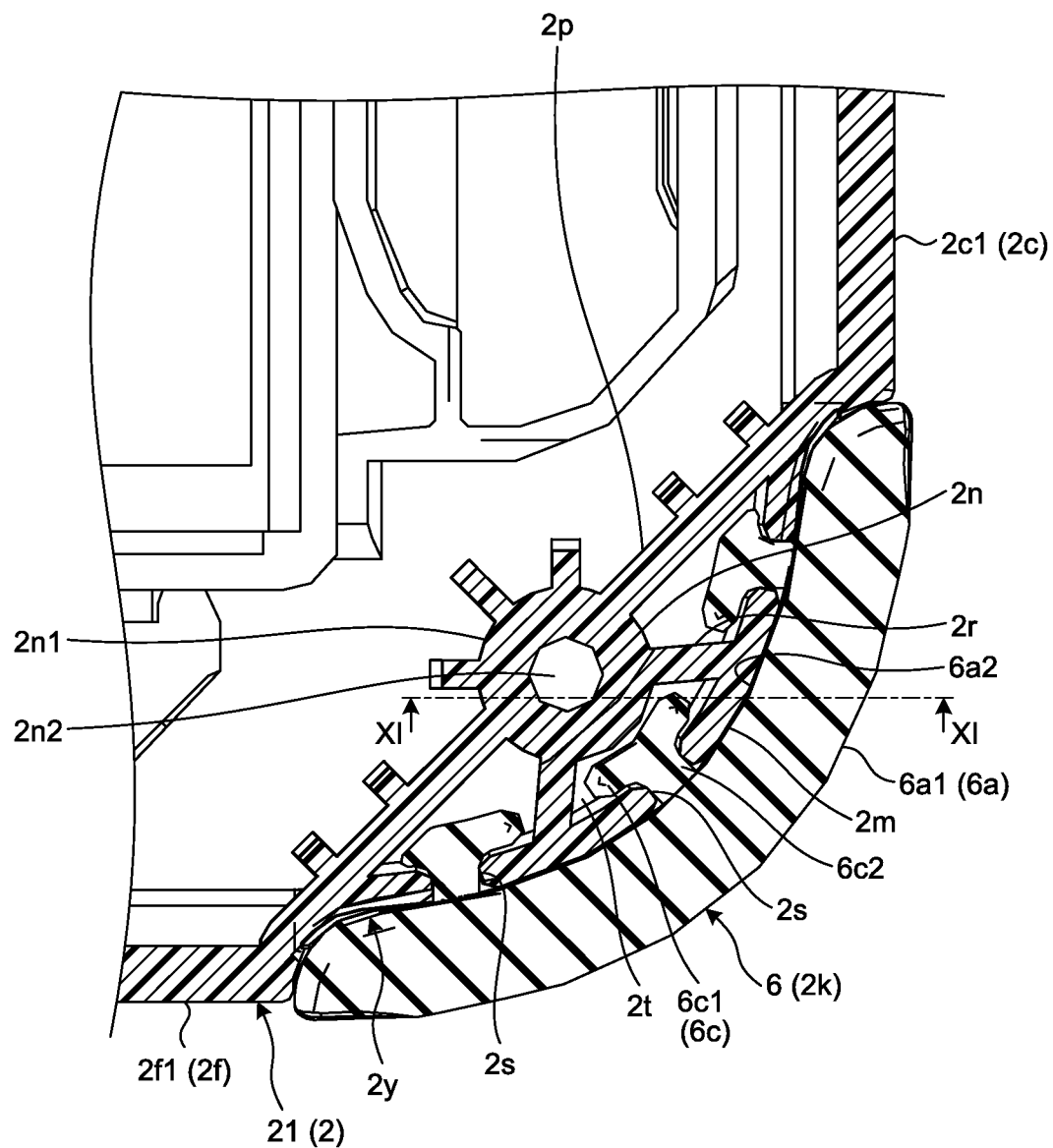
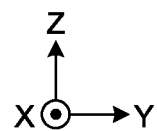

US 11,600,900 B2

ELECTRONIC DEVICE

CROSS-REFERENCE TO RELATED APPLICATIONS

This application is based upon and claims the benefit of priority from Japanese Patent Application No. 2019-174733, filed on Sep. 25, 2019, the entire contents of which are incorporated herein by reference.

FIELD

The present disclosure relates to an electronic device.

BACKGROUND

Conventionally known as an electronic device is a tablet-type personal computer that includes a casing, an antenna, a plurality of screw members each connecting a first cover and a second cover of the casing, and a board provided near the antenna. The board is fastened along with the first cover and the second cover by the screw members.

In such a type of electronic device, it is beneficial to obtain a novel configuration improved to further reduce inconveniences such as enabling degradation of antenna characteristics to be suppressed.

SUMMARY

An electronic device according to the present disclosure includes: a casing that includes a first cover including a first wall from which a display screen of a display device is exposed, and a second cover overlapping with the first cover in a first direction intersecting with the display screen; an antenna provided between the first cover and the second cover; a plurality of screw members connecting the first cover and the second cover; and a board provided, on an opposite side of the antenna, away from one of the screw members that is closest to the antenna, the board being provided without being fastened along with the first cover and the second cover by the one of the screw members.

BRIEF DESCRIPTION OF THE DRAWINGS

FIG. 10 is an exemplary cross section view of the elastic body according to one or more embodiments;

DETAILED DESCRIPTION OF EMBODIMENTS

According to the present disclosure, it is possible to obtain an electronic device that has a novel configuration improved to further reduce inconveniences such as enabling degradation of antenna characteristics to be suppressed.

Embodiments of the present invention will be disclosed hereinafter. Configurations of the embodiments described below and functions and effects provided by the configurations are illustrative. The present disclosure can be implemented by configurations other than the configurations disclosed in the following embodiments. Also, according to the present disclosure, at least one of various effects (including derivative effects) obtained by the configurations can be obtained.

In the present specification, ordinal numbers are used only to distinguish components, members, parts, positions, directions, and the like and do not indicate order or priority.

Embodiments

Figure 1:
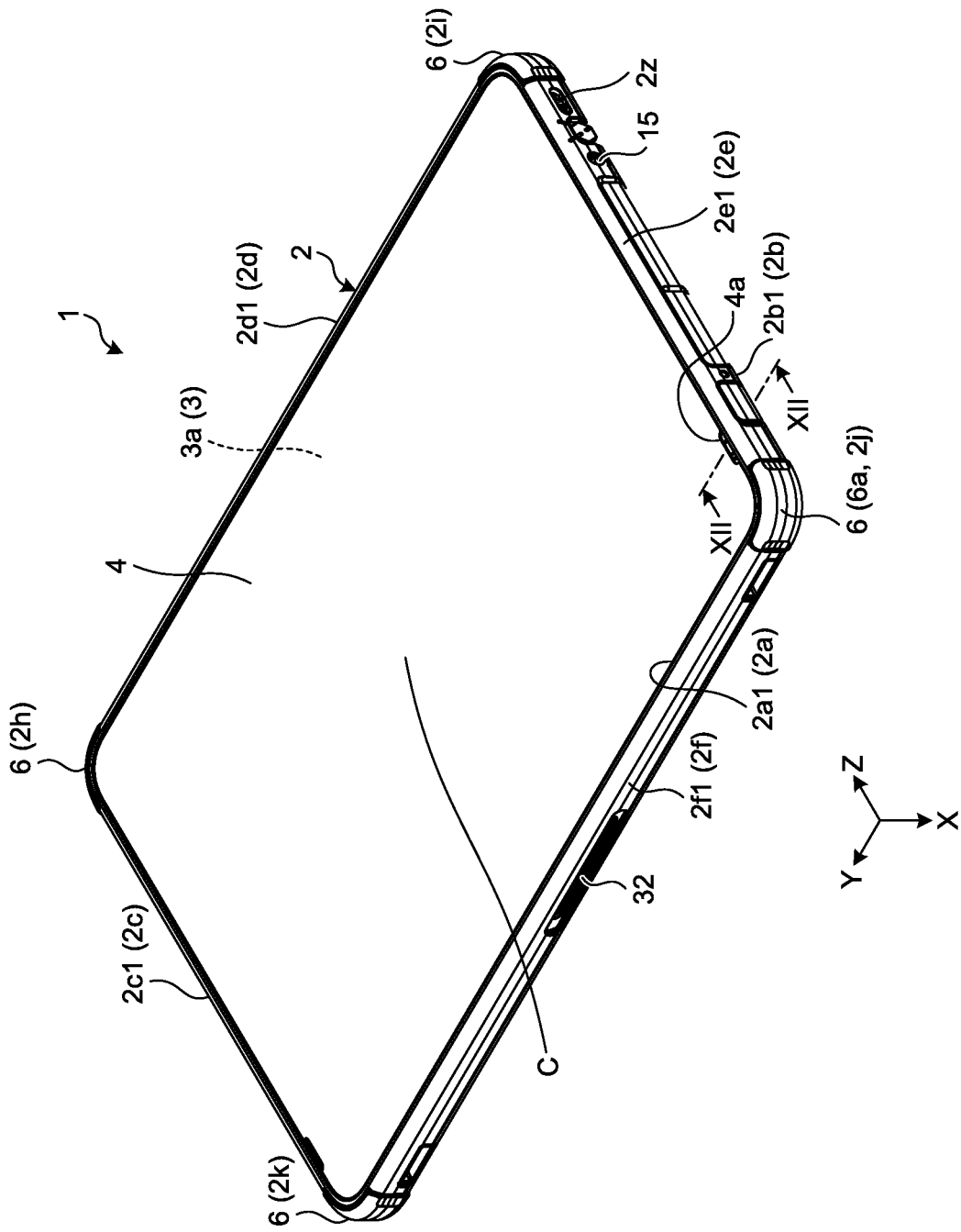
FIG. 1 is an exemplary perspective view of an electronic device according to one or more embodiments as viewed from a front side.
Figure 2:
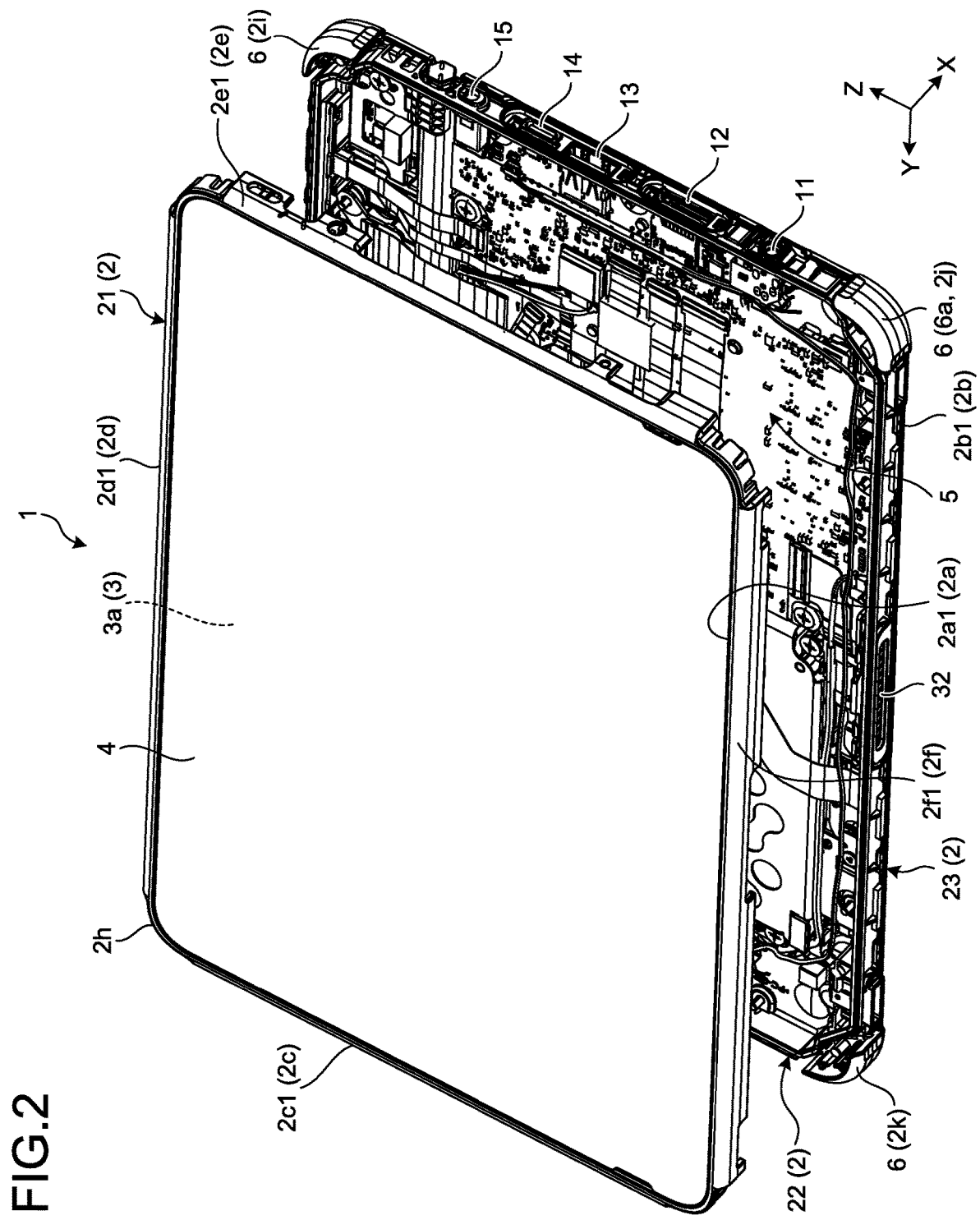
FIG. 2 is an exemplary exploded perspective view of the electronic device according to one or more embodiments as viewed from the front side.

FIG. 1 is a perspective view of an electronic device 1 according to one or more embodiments as viewed from a front side. FIG. 2 is an exploded perspective view of the electronic device 1 as viewed from the front side. In the following description, three directions perpendicular to each other are defined for convenience. An X direction is a thickness direction (a front-back direction) of the electronic device 1. A Y direction is a horizontal direction (a right-left direction or a longer side direction) of the electronic device 1. A Z direction extends in a vertical direction (an upper-lower direction or a shorter side direction) of the electronic device 1.

Furthermore, in the following description, the X direction is referred to as a back direction, and a direction opposite to the X direction is referred to as a front direction. The Y direction is referred to as a left direction, and a direction opposite to the Y direction is referred to as a right direction. The Z direction is referred to as an upper direction, and a direction opposite to the Z direction is referred to as a lower direction. The X direction is an example of a first direction, the Z direction is an example of a second direction, and the Y direction is an example of a third direction.

As illustrated in FIGS. 1 and 2, the electronic device 1 is configured as, for example, a tablet-type personal computer. The electronic device 1 includes a casing 2, a display device 3, a touch panel 4, a main board 5, an elastic body 6, an antenna 7 (refer to FIGS. 4 and 5) described below, and the like. Note that the electronic device 1 is not limited to the above example and may be, for example, a smartphone, a mobile phone, or a game machine. The electronic device 1 is also referred to as a portable information device or the like.

The casing 2 is formed in, for example, a rectangular solid box shape flattened in the X direction. The casing 2 includes a plurality of walls such as a front wall 2a, a back wall 2b, a left wall 2c, an upper wall 2d, a right wall 2e, and a lower wall 2f. The left wall 2c, the upper wall 2d, the right wall 2e, and the lower wall 2f are also referred to as sidewalls, surrounding walls, standing walls, and the like.

The front wall 2a is formed in a rectangular frame shape from which a display screen 3a of the display device 3 is exposed. The back wall 2b is formed in a rectangular plate shape extending on a direction perpendicular to the X direction (Y-Z plane) and is provided away from the front wall 2a in the X direction. The front wall 2a constitutes a front end of the casing 2, and the back wall 2b constitutes a back end of the casing 2. The front wall 2a is an example of a first wall.

The left wall 2c and the right wall 2e each extend in a direction perpendicular to the Y direction (X-Z plane). The left wall 2c and the right wall 2e are provided in parallel to and away from each other in the Y direction. The left wall 2c extends between Y-direction ends of the front wall 2a and the back wall 2b. The right wall 2e extends between opposite Y-direction ends of the front wall 2a and the back wall 2b. The left wall 2c constitutes a left end of the casing 2, and the right wall 2e constitutes a right end of the casing 2.

The upper wall 2d and the lower wall 2f each extend in a direction perpendicular to the Z direction (X-Y plane). The upper wall 2d and the lower wall 2f are provided in parallel to and away from each other in the Z direction. The upper wall 2d extends between Z-direction ends of the front wall 2a and the back wall 2b. The lower wall 2f extends between opposite Z-direction ends of the front wall 2a and the back wall 2b. The upper wall 2d constitutes an upper end of the casing 2, and the lower wall 2f constitutes a lower end of the casing 2.

As illustrated in FIG. 2, the right wall 2e is provided with a plurality of input/output units 11 to 15. The input/output units 11 to 15 are connected to the main board 5. In one or more embodiments, it is assumed that the input/output unit 11 is a DC-IN connector, the input/output unit 12 is an SD card connector, the input/output unit 13 is a USB connector, and the input/output unit 14 is a Type-C USB connector, and the input/output unit 15 is an audio connector. The input/output units 11 to 15 are also referred to as input/output ports or the like.

Figure 3:
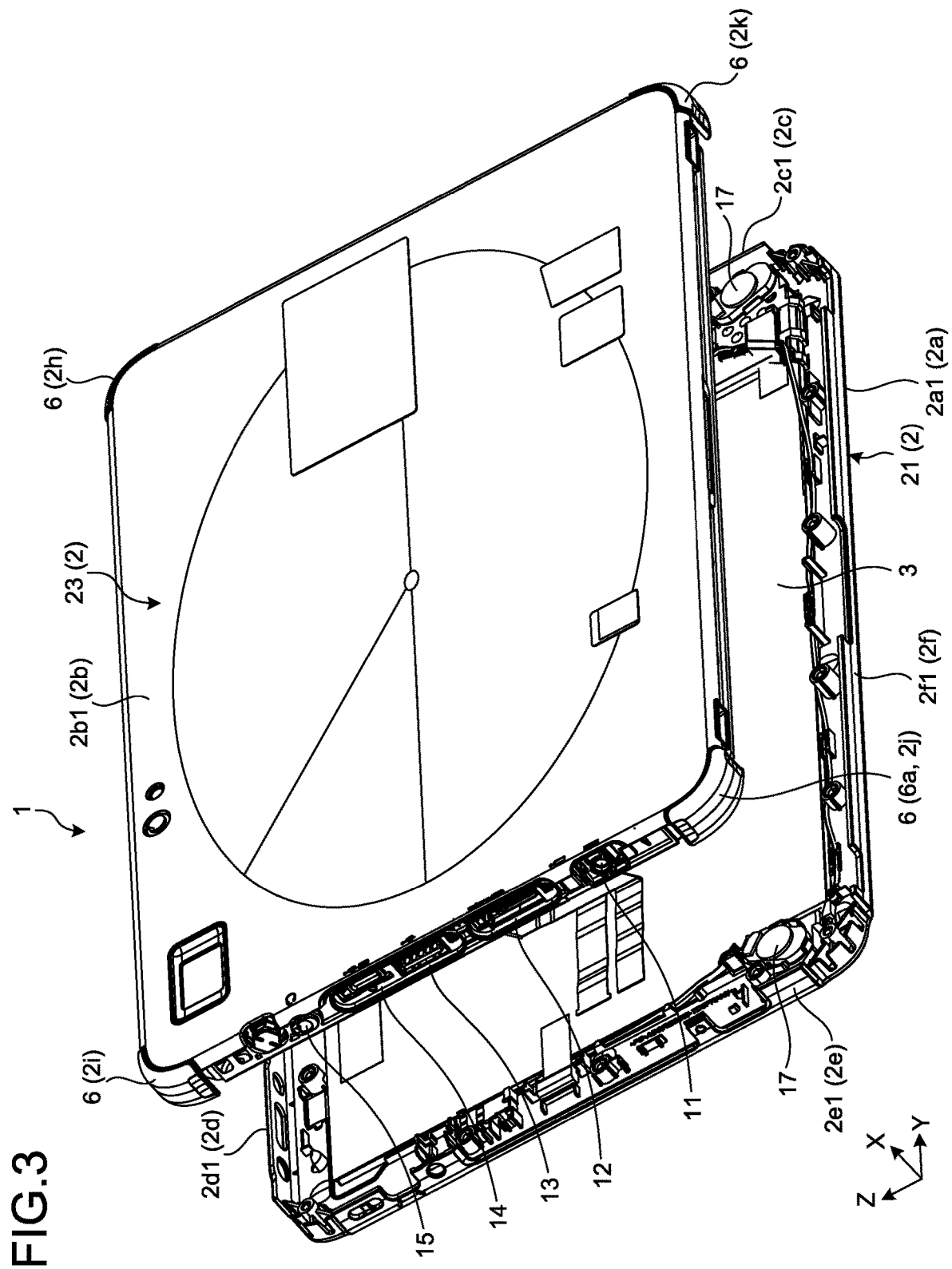
FIG. 3 is an exemplary exploded perspective view of the electronic device according to one or more embodiments as viewed from a backside.

Note that the input/output units 11 to 15 are not limited to these examples and may include, for example, a power button and an operation unit such as a volume button for a loudspeaker 17 (refer to FIG. 3). In one or more embodiments, more than half of the input/output units 11 to 15 including the above examples are provided at the right wall 2e. The right wall 2e (right end) is an example of a first end. Note that the input/output units 11 to 14 are covered with, for example, a lid that can be opened and closed. The right wall 2e is also provided with a hook 2z or the like for hooking a tether of a touch pen.

An antenna 7 (refer to FIGS. 4 and 5) described below is provided near the left wall 2c. The antenna 7 and the plurality of input/output units 11 to 15 (main board 5) are provided away from each other in the Y direction. The upper wall 2d (upper end) and the lower wall 2f (lower end) are examples of a second end, and the left wall 2c (left end) is an example of a third end. Note that the lower wall 2f is provided with a connector 32 for docking with a peripheral device.

The casing 2 includes four corners 2h to 2k. The corner 2h is formed by an intersection of the left wall 2c and the upper wall 2d. The corner 2i is formed by an intersection of the upper wall 2d and the right wall 2e. The corner 2j is formed by an intersection of the right wall 2e and the lower wall 2f. The corner 2k is formed by an intersection of the lower wall 2f and the left wall 2c. Each of the corners 2h to 2k is formed in a rounded corner shape (R-corner) and is covered by the elastic body 6 described below.

Figure 4:
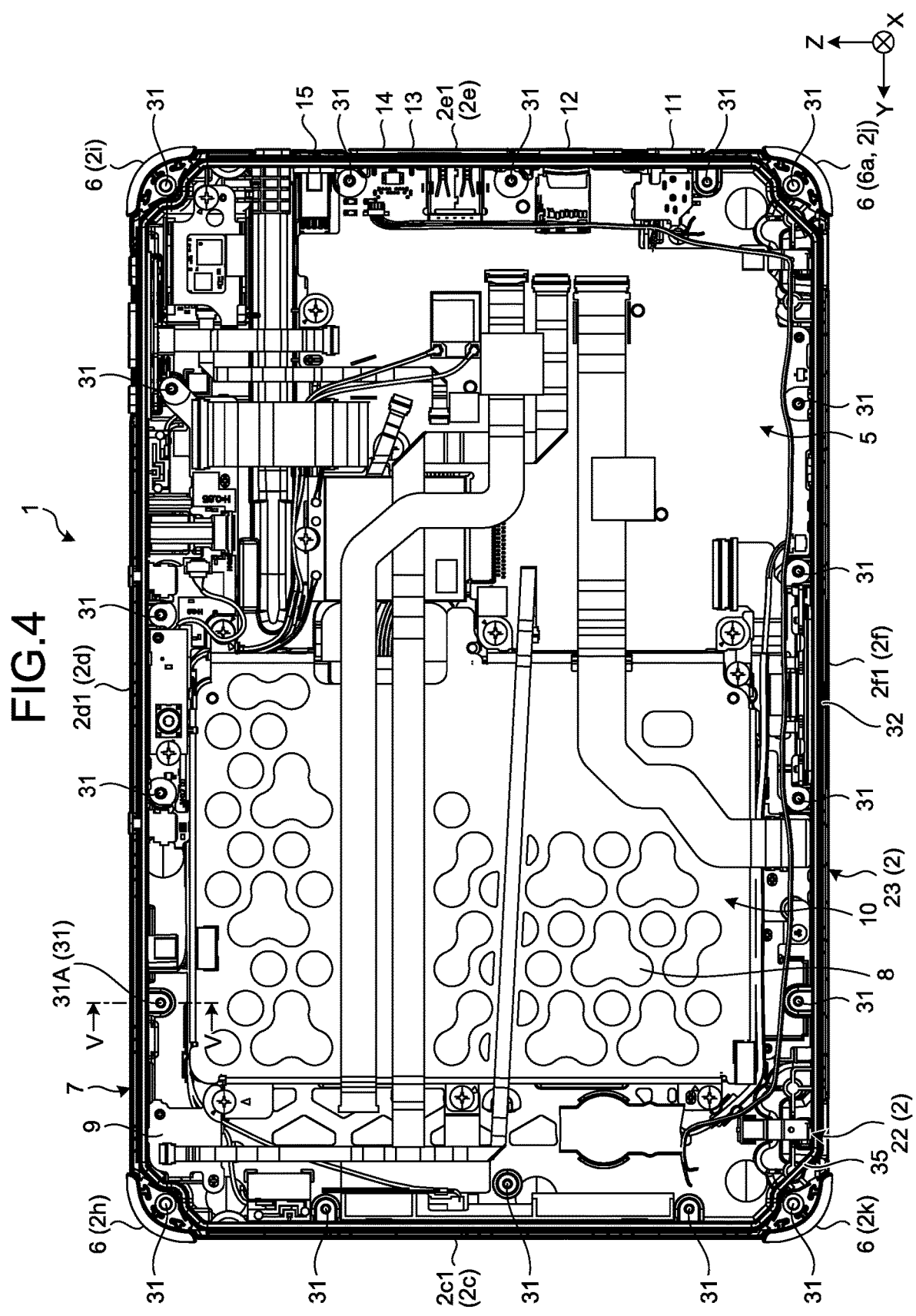
FIG. 4 is an exemplary plan view of a middle cover and a rear cover in FIG. 2.
Figure 5:
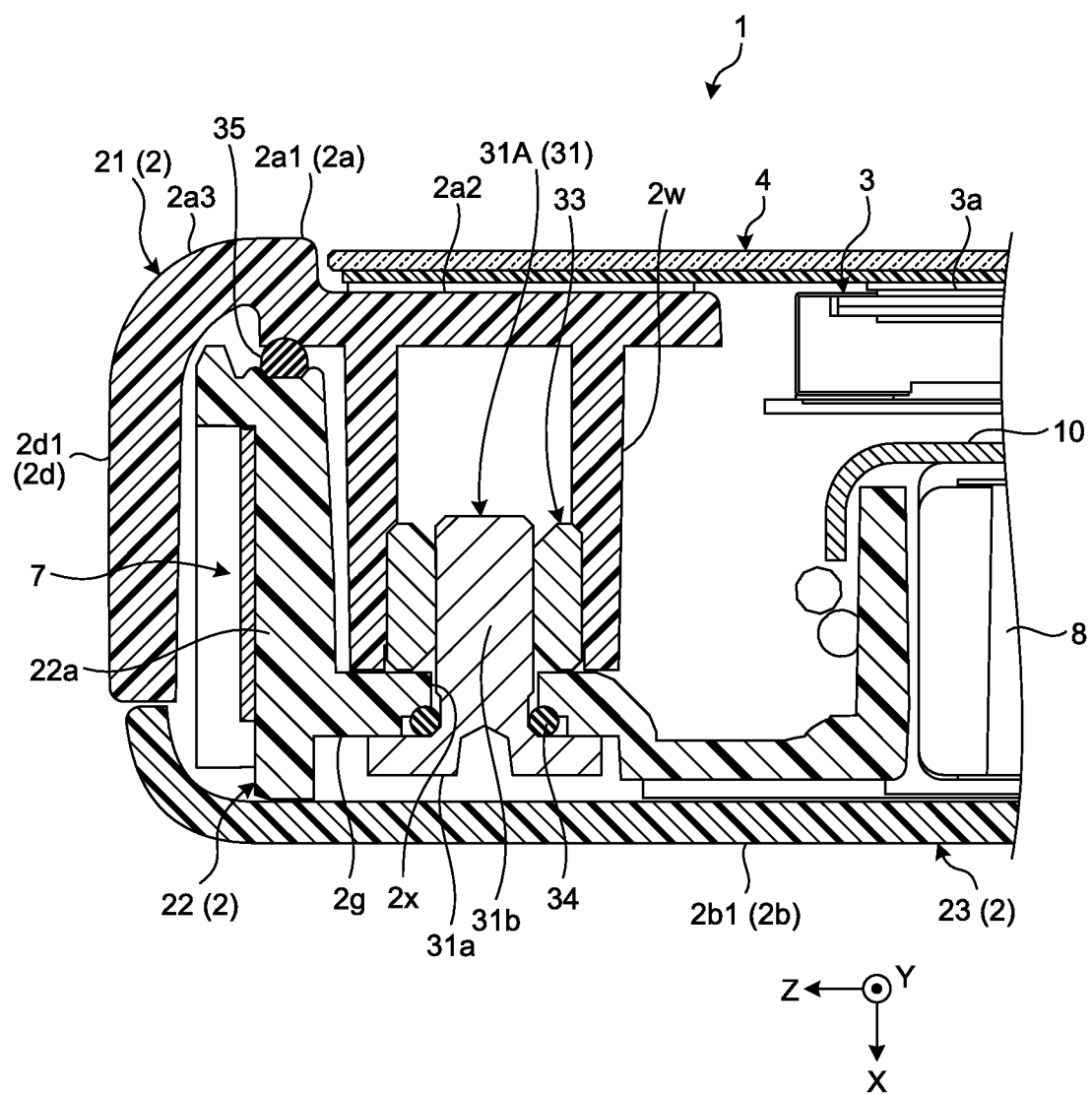
FIG. 5 is a cross section of V-V in FIG. 4.

FIG. 3 is an exploded perspective view of the electronic device 1 as viewed from a back side. FIG. 4 is a plan view of a middle cover 22 and a rear cover 23 in FIG. 2. FIG. 5 is a cross section of V-V in FIG. 4. As illustrated in FIGS. 3 to 5, the casing 2 is formed by, for example, a combination of a plurality of components (component bodies) such as a front cover 21, the middle cover 22, and the rear cover 23. The front cover 21, the middle cover 22, and the rear cover 23 are arranged in the X direction.

The rear cover 23 includes, for example, respective parts (back side) of the back wall 2b, the left wall 2c, the upper wall 2d, the right wall 2e, and the lower wall 2f. Internal components and the like are housed between the rear cover 23 and the middle cover 22. The rear cover 23 is coupled to (integrated with) the front cover 21 and the middle cover 22 by means of a so-called snap fit using a nail or a coupling tool such as a screw. The rear cover 23 is an example of a third cover.

The middle cover 22 includes, for example, a standing wall 22a (refer to FIG. 5) and a middle wall 2g. The standing wall 22a constitutes respective parts (inner side) of the left wall 2c, the upper wall 2d, the right wall 2e, and the lower wall 2f. The middle wall 2g is provided between the front wall 2a and the back wall 2b. The middle wall 2g extends between the left wall 2c and the right wall 2e and between the upper wall 2d and the lower wall 2f. The middle cover 22 is an example of a second cover, and the middle wall 2g is an example of a fifth wall.

The front cover 21 includes, for example, respective parts (front side) of the front wall 2a, the left wall 2c, the upper wall 2d, the right wall 2e, and the lower wall 2f. The display device 3 and the like are housed between the front cover 21 and the middle cover 22, for example. The front cover 21 is connected with the middle cover 22 by means of a screw member 31 such as a screw and a bolt. The front cover 21 is an example of a first cover. The front cover 21, the middle cover 22, and the rear cover 23 are made of, for example, a synthetic resin material.

The screw member 31 includes, for example, a head part 31a and a shaft part 31b. The head part 31a is disposed on a side of the middle cover 22 opposite to the front cover 21, that is, on the X-direction side. The head part 31a has a larger diameter than a through hole 2x provided in the middle wall 2g of the middle cover 22. The head part 31a is also referred to as a first part or the like.

The shaft part 31b extends from the head part 31a in a direction opposite to the X direction and is inserted into the through hole 2x. On an outer peripheral surface of the shaft part 31b is provided a male screw that meshes with a female screw of a nut 33 provided on the front cover 21. The screw member 31 is also referred to as a male screw member or the like, and the shaft part 31b is also referred to as a second part or the like.

A ring-shaped seal member 34 is provided between the head part 31a and a fringe part of the through hole 2x. The seal member 34 is made of, for example, silicone rubber. The fringe part of the through hole 2x is sealed by fastening the screw member 31 and the nut 33 while the seal member 34 is sandwiched between the head part 31a and the middle cover 22.

The screw member 31 is provided inside the standing wall 22a of the middle cover 22. As illustrated in FIG. 4, in one or more embodiments, a plurality of screw members 31 are provided along a peripheral edge of the casing 2, that is, along the left wall 2c, the upper wall 2d, the right wall 2e, and the lower wall 2f. At a position on the front cover 21 corresponding to the screw member 31, a tubular part 2w with which the nut 33 described above is integrated, a boss part 2n (refer to FIG. 6) provided with a female screw, and the like are provided.

In one or more embodiments, the main board 5 (refer to FIG. 4) is provided, on an opposite side of the antenna 7

(inside the casing 2), away from a screw member 31A that is closest to the antenna 7 out of the screw members 31. That is, the main board 5 is provided so as not to be fastened along with the front cover 21 and the middle cover 22 by the screw member 31A. The main board 5 is an example of a board.

On the main board 5, for example, a plurality of electronic components such as a central processing unit (CPU), a read only memory (ROM), and a random-access memory (RAM) are mounted. Wires in the main board 5 and the plurality of electronic components constitute at least part of a control circuit of the electronic device 1.

A battery 8 is provided on the Y-direction side of the main board 5. The battery 8 is covered by a sheet metal member 10 from an opposite direction of the X-direction, for example. That is, the sheet metal member 10 separates the battery 8 from the display device 3. The sheet metal member 10 is made of a conductive metal material. The sheet metal member 10 is a ground member.

The display device 3 (refer to FIG. 5) is, for example, a liquid crystal display (LCD). The display device 3 is formed in a rectangular solid shape flattened in the X direction. The display screen 3a of the display device 3 is covered with a transparent part of the touch panel 4. Note that the display device 3 is not limited to this example and may be, for example, an organic electro-luminescent display (OELD). Also, the touch panel 4 may be configured as a so-called in-cell touch panel incorporated in the display device 3, for example.

The touch panel 4 is formed in a shape of a rectangular thin plate that covers the display screen 3a. The touch panel 4 includes, for example, a plurality of layers laminated in the X direction such as a glass layer, a sensor layer, and a protective film layer. The touch panel 4 is housed in, for example, a recess 2a2 provided in the front wall 2a. A surface of the touch panel 4 is provided to be lower in the X direction than a surface 2a1 of the front wall 2a. Thus, the touch panel 4 is protected by the front wall 2a.

The antenna 7 is provided on a side of the standing wall 22a opposite to the screw member 31A (outside the casing 2). The antenna 7 is housed in, for example, a space in the Z direction between the upper wall 2d of the front cover 21 and the standing wall 22a of the middle cover 22. The antenna 7 is electrically connected to an antenna board 9 (refer to FIG. 4) through a cable or the like. The antenna board 9 is provided with an electronic circuit. The antenna 7 is also referred to as a main antenna or the like.

A seal member 35 is provided on an end surface of the standing wall 22a on a side opposite to the X-direction side. The seal member 35 is formed, for example, in a rectangular frame shape along the left wall 2c, the upper wall 2d, the right wall 2e, and the lower wall 2f. In other words, the seal member 35 is provided between: the plurality of screw members 31; and the left wall 2c, the upper wall 2d, the right wall 2e, and the lower wall 2f each serving as the peripheral edge of the casing 2. Also, the seal member 35 includes a part provided between the screw member 31A and the antenna 7.

In one or more embodiments, the front cover 21 and the middle cover 22 are connected to each other while the seal member 35 is compressed in the X direction by the screw members 31, and thereby a space between the front cover 21 and the middle cover 22 is sealed over the entire circumference. As a result, water droplets, dust, and the like are prevented from entering the inside of the casing 2. The seal member 35 is made of, for example, acrylic rubber.

Figure 6:
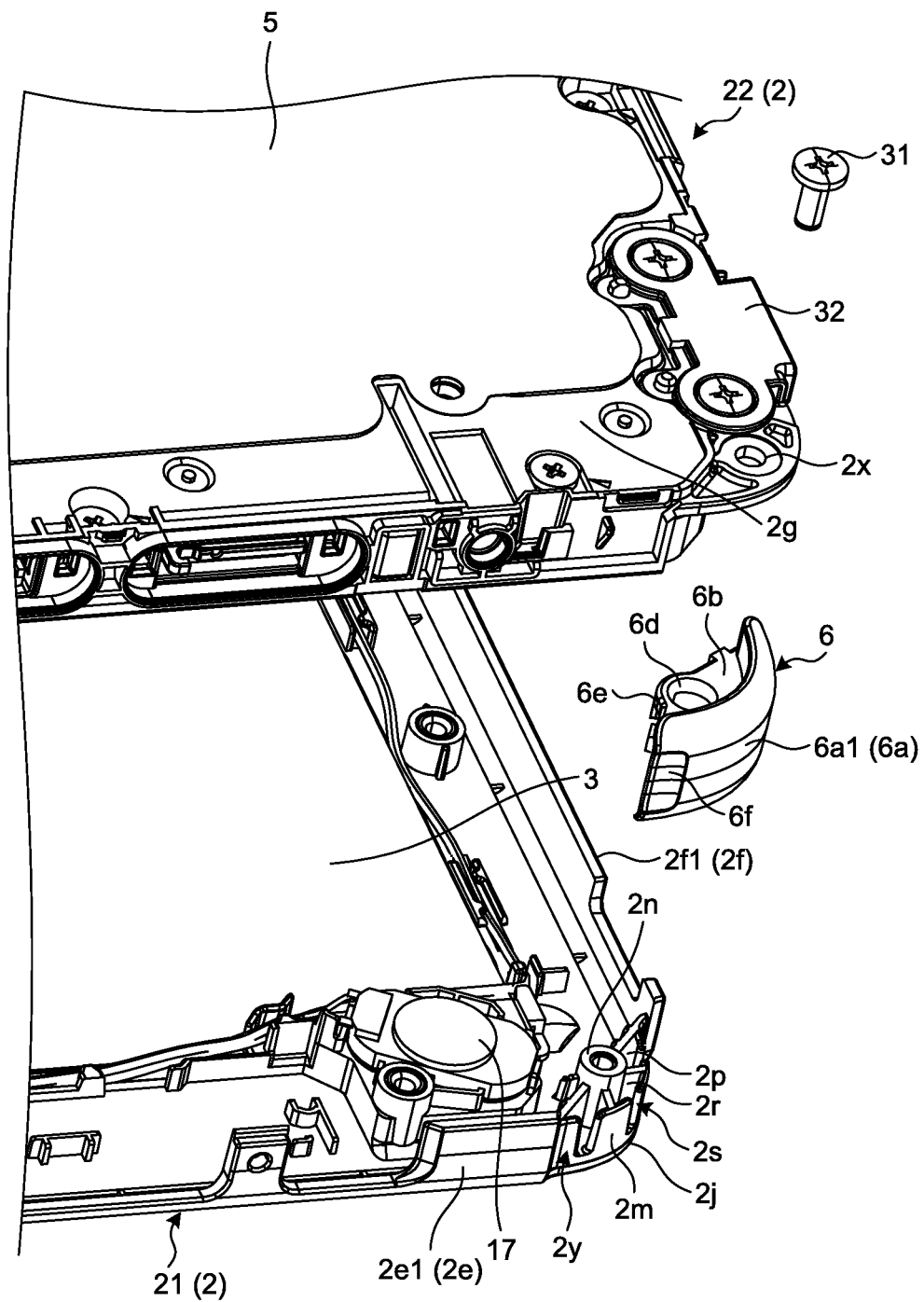
FIG. 6 is an exploded perspective view in the vicinity of a corner in FIG. 4.
Figure 7:
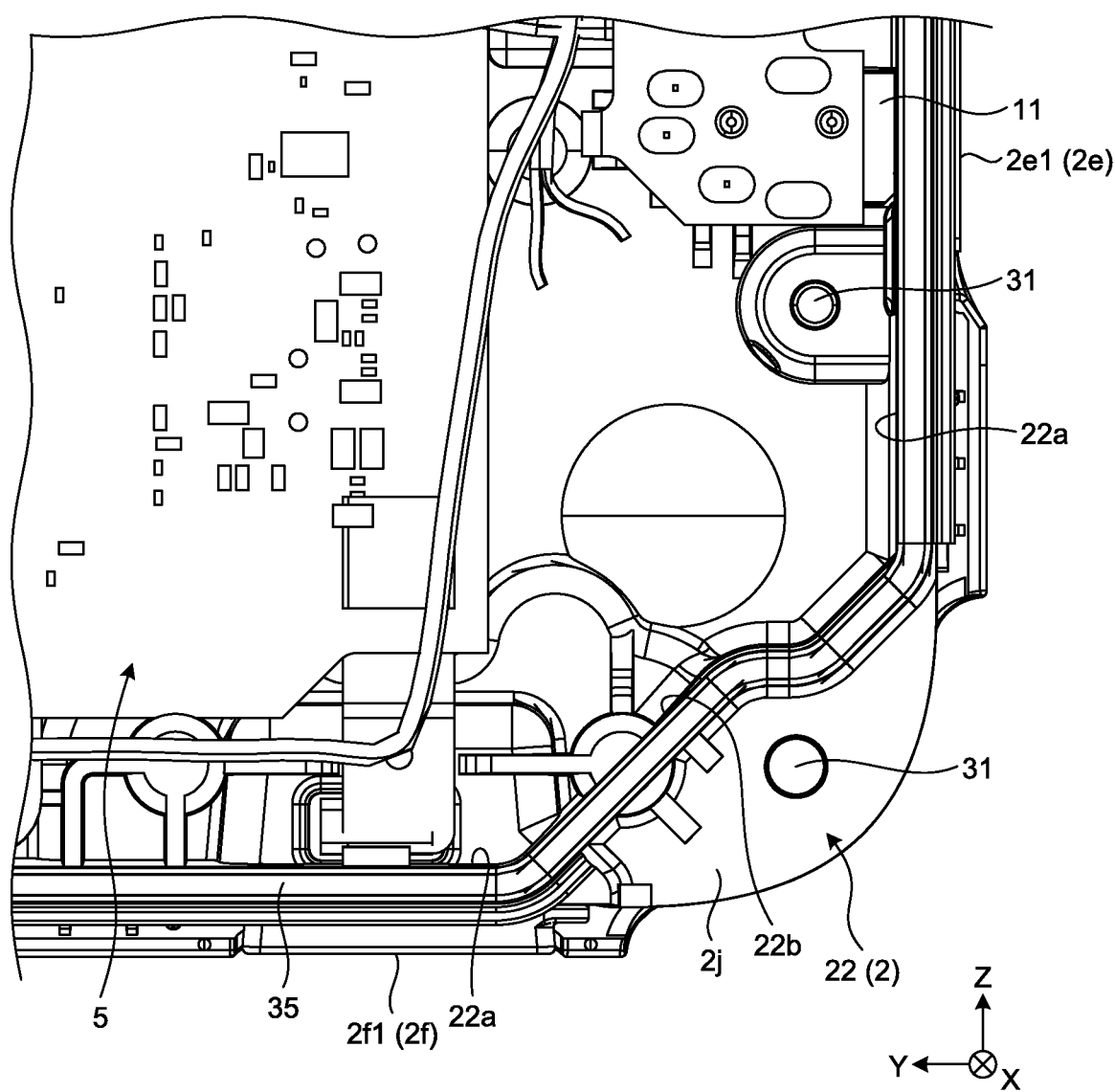
FIG. 7 is an enlarged view of the corner in the middle cover in FIG. 4.

FIG. 6 is an exploded perspective view of a part near the corner 2j in FIG. 4. FIG. 7 is an enlarged view of the corner 2j of the middle cover 22 in FIG. 4. As illustrated in FIG. 6, the elastic body 6 is detachably (separably) mounted on each of the four corners 2h to 2k of the casing 2. Specifically, the elastic body 6 is fastened (fixed) along with the middle cover 22 to the boss part 2n of the front cover 21 by the screw member 31 penetrating the aforementioned through hole 2x.

The elastic body 6 is made of, for example, an elastomer or rubber. The elastic body 6 has a function of suppressing interference of the casing 2 with a not-illustrated installation surface on which the electronic device 1 is to be installed, a function of suppressing the casing 2 from sliding or wobbling with respect to the installation surface, a function of protecting the corners 2h to 2k of the casing 2, and the like. The elastic body 6 is also referred to as a protective member (corner guard), a non-slip member, a rubber leg, or the like.

The elastic body 6 includes, for example, a base part 6a and an attaching piece 6b. The base part 6a is formed, for example, in an arc shape centering on a central part C (refer to FIG. 1) of the casing 2. In other words, the base part 6a is curved from each of the corners 2h to 2k to protrude toward an opposite side of the central part C. The base part 6a covers each of the corners 2h to 2k from the opposite side of the central part C, that is, from the outside of the casing 2. The base part 6a is also referred to as a cover part, an exposed part, or the like.

The attaching piece 6b projects out from the base part 6a toward the central part C. The attaching piece 6b is provided with an opening 6d through which the aforementioned screw member 31 and boss part 2n penetrate in the X direction. The elastic body 6 is coupled with (fixed to) the casing 2 while the attaching piece 6b is sandwiched between the front cover 21 and the middle cover 22. The attaching piece 6b is also referred to as an overhanging part, an extending part, a horizontal part, or the like.

Supposing that the middle cover 22 is sandwiched between the attaching piece 6b and the front cover 21, a relatively large bearing surface of the head part 31a needs to be secured to suppress breakage of the attaching piece 6b due to the screw member 31. In this respect, according to one or more embodiments, the attaching piece 6b is sandwiched between the front cover 21 and the middle cover 22, so that a large bearing surface of the head part 31a does not need to be secured for the attaching piece 6b, and the amount of projection of the attaching piece 6b toward the central part C can thus be reduced further.

As illustrated in FIG. 7, the middle cover 22 is provided with an inclined wall 22b. The inclined wall 22b projects out from the middle wall 2g in a direction opposite to the X direction. The inclined wall 22b is inclined with respect to the standing wall 22a of the right wall 2e and the left wall 2c and the standing wall 22a of the upper wall 2d and the lower wall 2f. The inclined wall 22b extends between those two standing walls 22a. The inclined wall 22b is disposed adjacent to a side of the attaching piece 6b closer to the central part C while the elastic body 6 is mounted between the front cover 21 and the middle cover 22 (refer to FIG. 11). The inclined wall 22b is an example of a second wall.

According to one or more embodiments, since the amount of projection of the attaching piece 6b toward the central part C can further be reduced, the two standing walls 22a can be diagonally connected by the inclined wall 22b at the shortest distance. As a result, for example, it is possible to secure a larger housing space of the casing 2, which is located closer to the central part C than the inclined wall 22b.

Figure 8:
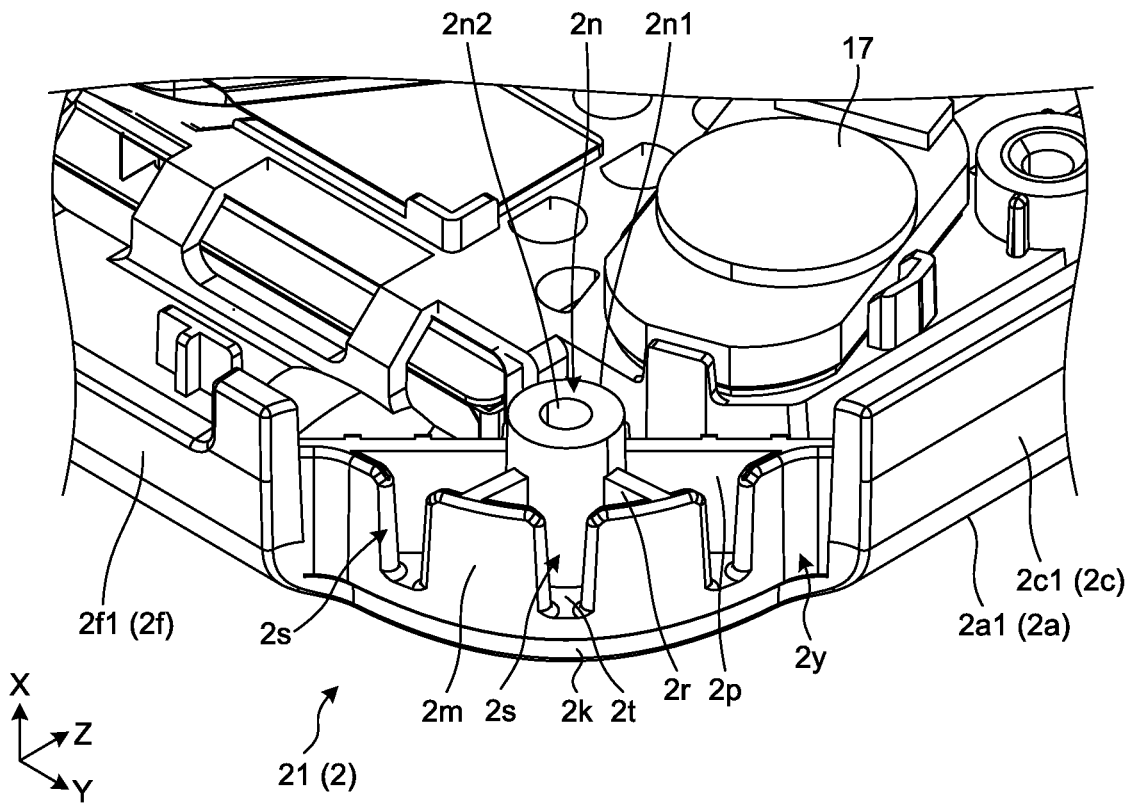
FIG. 8 is an enlarged view of the corner in a front cover in FIG. 3.
Figure 9:
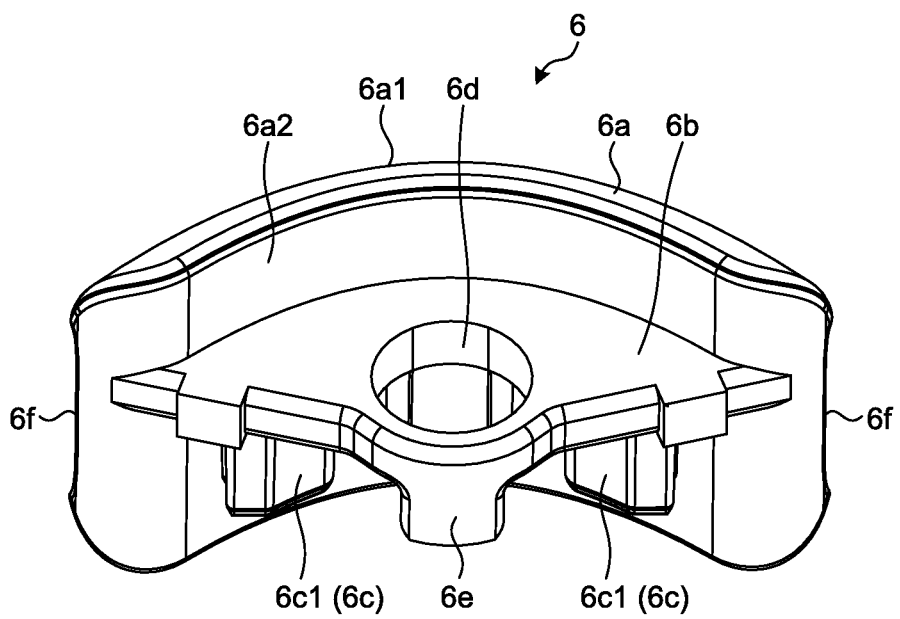
FIG. 9 is an exemplary perspective view of an elastic body according to one or more embodiments.
Figure 11:
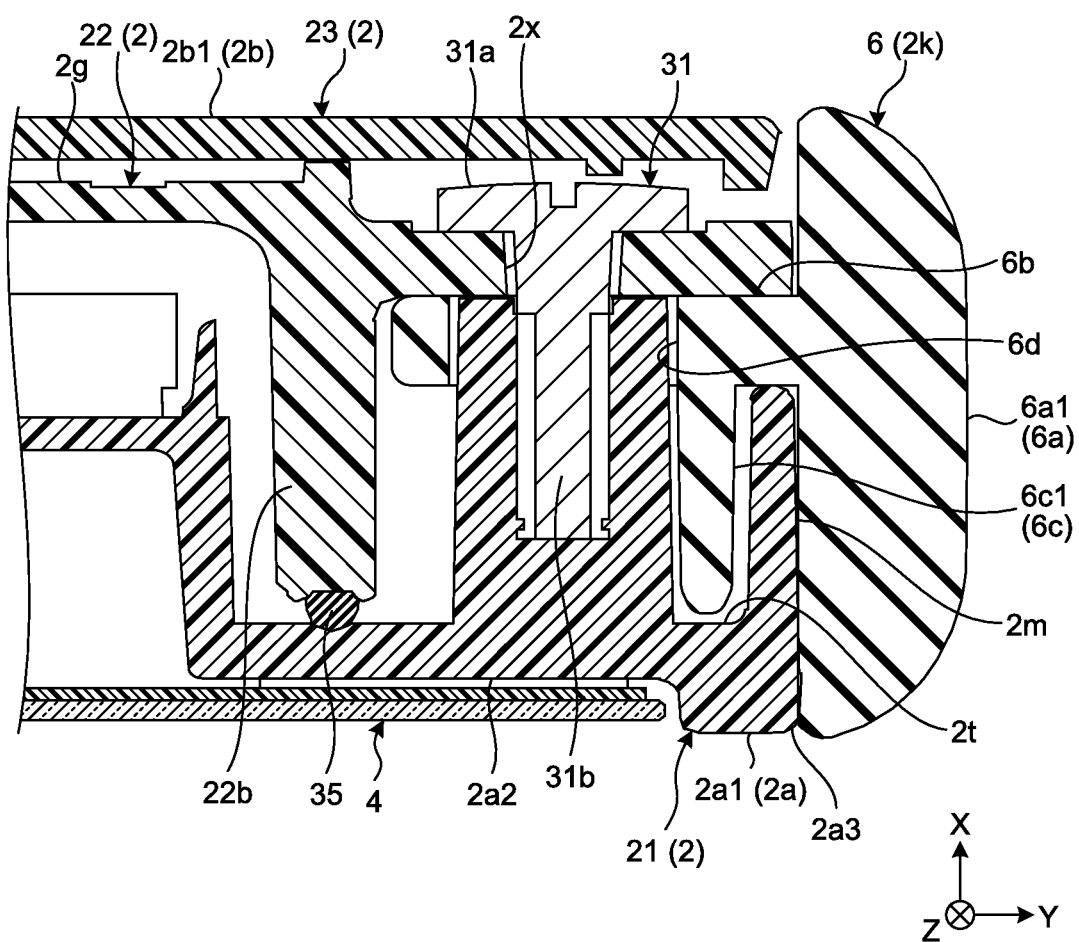
FIG. 11 is a cross section of XI-XI in FIG. 10.

Next, a mounting structure of the elastic body 6 will be described in detail. FIG. 8 is an enlarged view of the corner 2k in the front cover 21 in FIG. 3. FIG. 9 is a perspective view of the elastic body 6. FIG. 10 is a cross section view of the elastic body 6. FIG. 11 is a cross section of XI-XI in FIG. 10. Note that respective structures (shapes) of the corner 2k and the elastic body 6 disposed at the corner 2k are the same as structures (shapes) of each of the other corners 2h to 2j and each of the elastic bodies 6 disposed at the corners 2h to 2j.

As illustrated in FIGS. 8 to 11, the corner 2k of the front cover 21 is provided with a plurality of mounting walls such as a standing wall 2m, a rib 2p, a boss part 2n, and a partition wall 2r. The standing wall 2m, the rib 2p, the boss part 2n, and the partition wall 2r respectively project from the front wall 2a in the X direction, that is, in the back direction.

The standing wall 2m is provided between the lower wall 2f and the left wall 2c that constitute the corner 2k. The standing wall 2m is formed in an arc shape along the base part 6a of the elastic body 6. Specifically, the standing wall 2m is curved from the corner 2k to protrude toward an opposite side of the central part C. The standing wall 2m is provided with a plurality of groove parts 2s opened in the X direction. The groove part 2s is also referred to as a slit, a notch, or the like.

In addition, between the standing wall 2m and the lower wall 2f and between the standing wall 2m and the left wall 2c, a dent part 2y dented toward the central part C is provided. In other words, a surface 2f1 of the lower wall 2f and a surface 2c1 of the left wall 2c project out from a surface of the standing wall 2m toward an opposite side of the central part C. As illustrated in FIGS. 10 and 11, the elastic body 6 is integrated with the front cover 21 (casing 2) while the base part 6a closes (covers) the dent part 2y. The dent part 2y is also referred to as a bump or the like.

The boss part 2n is provided away from the standing wall 2m on a side of the standing wall 2m closer to the central part C, that is, inside the casing 2. The boss part 2n is formed in a cylindrical shape and includes an outer peripheral surface 2n1 and an inner peripheral surface 2n2. The inner peripheral surface 2n2 is provided with a female screw meshing with the male screw of the aforementioned screw member 31. The boss part 2n projects out from the rib 2p and the partition wall 2r in the X direction. The outer peripheral surface 2n1 of the boss part 2n on a tip end side faces the inside surface of the opening 6d of the aforementioned attaching piece 6b.

The rib 2p is inclined with respect to the lower wall 2f and the left wall 2c. The rib 2p extends between the lower wall 2f and the boss part 2n and between the left wall 2c and the boss part 2n. A groove part 2t opened in the X direction is provided between the rib 2p and the standing wall 2m. The groove part 2t links with a side of the standing wall 2m opposite to the central part C (outside of the casing 2) though the groove part 2s. The groove part 2t is also referred to as a housing chamber, a hollow, or the like.

The partition wall 2r extends between the standing wall 2m and the boss part 2n. The front cover 21 is provided with a plurality of partition walls 2r at intervals in a circumferential direction (longer side direction) of the standing wall 2m. The partition walls 2r partition the groove part 2t into a plurality of spaces in the circumferential direction of the standing wall 2m. An engaging part 6c (refer to FIGS. 9 to 11) of the elastic body 6 is engaged with each set including the groove part 2t and groove part 2s.

The engaging part 6c projects out from the base part 6a toward the central part C (toward the standing wall 2m). The engaging part 6c is provided to be displaced from the attaching piece 6b in a direction opposite to the X direction on an inside surface 6a2 of the base part 6a closer to the central part C. A plurality of engaging parts 6c corresponding to the groove parts 2s and 2t are provided at the base part 6a to be spaced from each other.

The engaging parts 6c each include, for example, a first part 6c1 and a second part 6c2 (refer to FIG. 10). The second part 6c2 extends from the base part 6a toward the central part C and penetrates the groove part 2s of the standing wall 2m. The first part 6c1 extends from an end of the second part 6c2 opposite to the base part 6a along the standing wall 2m. A YZ cross-section of the engaging part 6c perpendicular to the X direction is formed approximately in a T shape by the first part 6c1 and the second part 6c2.

The engaging part 6c is engaged with the groove parts 2s and 2t of the standing wall 2m from the X-direction side. The first part 6c1 faces a peripheral edge of the groove part 2s in the standing wall 2m while the engaging part 6c is engaged with the groove parts 2s and 2t. In other words, the standing wall 2m is sandwiched between the base part 6a and the first part 6c1. By this structure, movement of the elastic body 6 with respect to the front cover 21 to a side opposite to the central part C is restricted.

The elastic body 6 is provided with a projection 6e (refer to FIGS. 6 and 9). The projection 6e projects out from a peripheral edge of the opening 6d in the attaching piece 6b in an opposite direction of the X direction. The projection 6e reinforces part of the attaching piece 6b that is thinned due to the opening 6d. The projection 6e is supported by the outer peripheral surface 2n1 of the boss part 2n while the elastic body 6 is mounted on the front cover 21.

Also, the elastic body 6 is provided with a dent part 6f (refer to FIGS. 6 and 9). The dent part 6f is dented, toward the central part C, from an outside surface 6a1 on an opposite side of the inside surface 6a2 of the base part 6a. The dent part 6f is provided at each end of the base part 6a in the circumferential direction (longer side direction). The dent part 6f can function as a clearance groove for a peripheral device such as a cradle connected to the connector 32 (refer to FIGS. 1 and 6), for example.

In one or more embodiments, the base part 6a projects out toward an opposite side of the central part C (outside the casing 2) from respective surfaces 2c1, 2d1, 2e1, and 2f1 of the left wall 2c, the upper wall 2d, the right wall 2e, and the lower wall 2f while the elastic body 6 is mounted on the casing 2. Also, the base part 6a projects out from the surface 2a1 of the front wall 2a in an opposite direction of the X direction and projects out from a surface 2b1 of the back wall 2b in the X direction.

According to the above structure, interference of the casing 2 with the not-illustrated installation surface on which the electronic device 1 is to be installed is suppressed. As a result, for example, even in a case where the electronic device 1 is installed in any of a plurality of postures in which the front wall 2a, the back wall 2b, the left wall 2c, the upper wall 2d, the right wall 2e, and the lower wall 2f respectively face the installation surface, it is possible to suppress the electronic device 1 from sliding or wobbling with respect to the installation surface. Also, for example, even in a case where the electronic device 1 falls in any posture with respect to the installation surface, the elastic body 6 easily comes into contact with the installation surface, and protection performance of the casing 2, the touch panel 4, and the like can thus be enhanced further.

Figure 12:
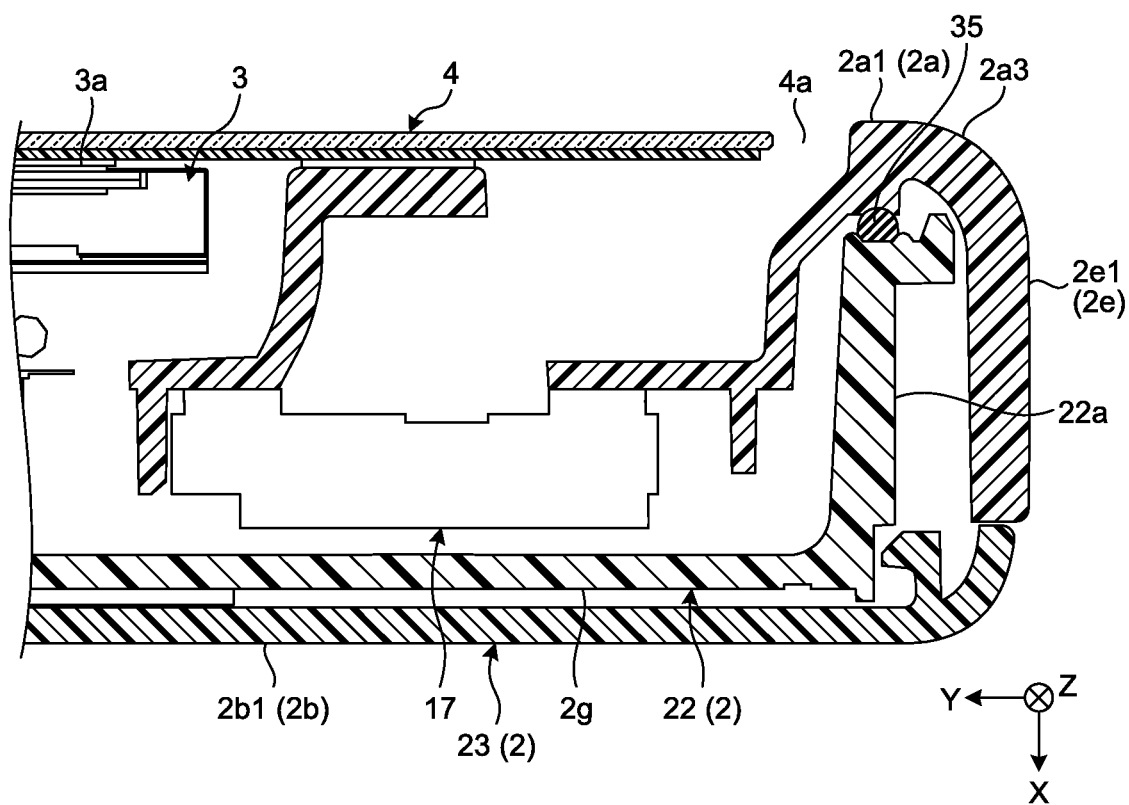
FIG. 12 is a cross section of XII-XII in FIG. 1.

FIG. 12 is a cross section of XII-XII in FIG. 1. As illustrated in FIG. 12, between the touch panel 4 and the right wall 2e, an opening 4a is provided, which forms part of a sound path connecting the loudspeaker 17 and the outside of the casing 2. Note that a configuration of the opening 4a (sound path) is substantially equal (symmetric) to the configuration of the opening 4a (sound path) provided between the touch panel 4 and the left wall 2c.

The opening 4a is, for example, a notched part formed by notching an end of the touch panel 4 provided with the right wall 2e. The opening 4a is dented in the Y direction and is opened in a direction opposite to the Y direction.

In this manner, in one or more embodiments, since the opening 4a is provided on the touch panel 4, not on the front cover 21, a uniform width of an edge 2a3 of the front wall 2a in the front cover 21 is easily secured over the entire circumference. Therefore, for example, design of the electronic device 1 is easily improved. Also, for example, since a relatively long width of the edge 2a3 can be ensured over the entire circumference, protection performance of the touch panel 4 can be enhanced more easily.

Also, in one or more embodiments, the edge 2a3 is formed in a rounded corner (R corner) shape as viewed in the Z direction. Thus, when a user puts his/her finger on the edge 2a3, he/she can more easily lift the electronic device 1 installed on the installation surface while the front wall 2a faces the installation surface. Further, for example, it is possible, by the edge 2a3, to suppress interference of the casing 2 with the installation surface.

As described above, in one or more embodiments, the electronic device 1 includes: the antenna 7 provided between the front cover 21 (first cover) and the middle cover 22 (second cover) of the casing 2; the plurality of screw members 31 connecting the front cover 21 with the middle cover 22; and the main board 5 (board) provided, on an opposite side of the antenna 7, away from the screw member 31A that is closest to the antenna 7 out of the screw members 31. The main board 5 is provided without being fastened along with the front cover 21 and the middle cover 22 by the screw member 31A.

According to such a configuration, it is possible to dispose the antenna 7 and the main board 5 away from each other. Consequently, for example, degradation of antenna characteristics can easily be suppressed. That is, it is possible to take measures against electromagnetic compatibility (EMC).

Also, in one or more embodiments, the electronic device 1 includes the seal member 35 that includes a part provided between the antenna 7 and the screw member 31A and seals a space between the front cover 21 and the middle cover 22.

According to such a configuration, the screw member 31A, which is not fastened along with the main board 5, can be disposed closer to the antenna 7 and the seal member 35. In addition, with use of the screw member 31A, the seal member 35 can be compressed in the X direction (first direction). Consequently, for example, it is not necessary to provide a claw for compressing the seal member 35, an opening for removing the claw at the time of molding, and the like around the seal member 35 in the front cover 21 and the middle cover 22, which reduces time and effort required for manufacture of the electronic device 1 and further reduces the size of the electronic device 1.

Also, in one or more embodiments, the casing 2 includes the right wall 2e (first end) extending in the Z direction (second direction) intersecting with the X direction. The right wall 2e is provided with the plurality of input/output units 11 to 15 different from the touch panel 4 and the antenna 7.

According to such a configuration, for example, the plurality of input/output units 11 to 15 are collected on the right wall 2e, so that operability of the electronic device 1 is easily improved.

Also, in one or more embodiments, the casing 2 includes: the upper wall 2d and the lower wall 2f (second end) intersecting with the right wall 2e; and the left wall 2c (third end) extending along the right wall 2e on a side of the upper wall 2d and the lower wall 2f opposite to the right wall 2e. The antenna 7 is provided closer to the left wall 2c than to the right wall 2e.

According to such a configuration, the antenna 7 and the plurality of input/output units 11 to 15 can be disposed to be further away from each other. Consequently, for example, degradation of antenna characteristics can more easily be suppressed.

Also, in one or more embodiments, the electronic device 1 includes the elastic body 6 that includes the base part 6a and the attaching piece 6b. The base part 6a covers each of the corners 2h to 2k between: the right wall 2e and the left wall 2c; and the upper wall 2d and the lower wall 2f. The attaching piece 6b projects out from the base part 6a toward the central part C of the casing 2 and is sandwiched between the front cover 21 and the middle cover 22.

According to such a configuration, the corners 2h to 2k can be protected by the elastic body 6. As a result, interference of the casing 2 with the installation surface on which the electronic device 1 is to be installed is easily suppressed. Also, the section modulus of the elastic body 6 increases due to the base part 6a and the attaching piece 6b, and the rigidity and strength of the elastic body 6 are easily secured even in a case where the elastic body 6 and the casing 2 are formed separately (separately molded). Also, for example, as compared with a case where the middle cover 22 is sandwiched between the attaching piece 6b and the front cover 21, a large bearing surface of the head part 31a of the screw member 31 does not need to be secured for the attaching piece 6b, and the amount of projection of the attaching piece 6b toward the central part C can thus be reduced more.

Also, in one or more embodiments, the middle cover 22 includes the inclined wall 22b (second wall) adjacent to a side of the attaching piece 6b closer to the central part C. The inclined wall 22b extends between the standing wall 22a constituting parts of the right wall 2e and the left wall 2c and the standing wall 22a constituting parts of the upper wall 2d and the lower wall 2f.

According to such a configuration, the amount of projection of the attaching piece 6b toward the central part C can further be reduced, so that the two standing walls 22a can be connected at the shortest distance diagonally. As a result, for example, a larger housing space of the casing 2 provided closer to the central part C than the inclined wall 22b is easily secured.

While certain embodiments have been described, these embodiments have been presented by way of example only and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a casing that includes
      a first cover including a first wall from which a display screen of a display device is exposed, and
      a second cover overlapping with the first cover in a first direction intersecting with the display screen;
   an antenna provided between the first cover and the second cover;
   a plurality of screw members connecting the first cover and the second cover;
   a board provided, on an opposite side of the antenna, away from one of the screw members that is closest to the antenna, the board being provided without being fastened along with the first cover and the second cover by the one of the screw members;
   a touch panel; and
   a plurality of input/output units different from the touch panel and the antenna, wherein the casing further includes
      a first end extending in a second direction intersecting with the first direction, the first end being provided with more than half of the plurality of input/output units,
      a second end intersecting with the first end, and
      a third end extending along the first end on a side of the second end opposite to the first end, and
   the antenna is provided closer to the third end than to the first end.

2. The electronic device according to claim 1, further comprising a seal member including a part provided between the antenna and the one of the screw members, the seal member sealing a space between the first cover and the second cover.

3. The electronic device according to claim 1, further comprising an elastic body that includes
   a base part covering a corner between the first end or the third end and the second end, and
   an attaching piece that projects out from the base part toward a central part of the casing and is sandwiched between the first cover and the second cover.

4. The electronic device according to claim 3, wherein the second cover includes a second wall adjacent to a side of the attaching piece closer to the central part, the second wall extending between the first end or the third end and the second end.

* * * * *